United States Patent
Zheng et al.

(10) Patent No.: US 9,892,746 B1
(45) Date of Patent: Feb. 13, 2018

(54) ABS DESIGN WITH SOFT BUMPER PADS (SBP) FOR MITIGATING MEDIA DAMAGE AND THERMAL ERASURE IN HARD DISK DRIVES (HDD)

(71) Applicants: SAE Magnetics (H.K.) Ltd., Shatin, N.T. (HK); Headway Technologies, Inc., Milpitas, CA (US)

(72) Inventors: Guoqiang Zheng, San Ramon, CA (US); Ellis Cha, San Ramon, CA (US); Zhijun Liu, Dongguan (CN); Qinghua Zeng, Fremont, CA (US)

(73) Assignees: SAE Magnetics H.K. Ltd., Shatin, N.T. (HK); Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/431,811

(22) Filed: Feb. 14, 2017

(51) Int. Cl.
| | |
|---|---|
| G11B 5/31 | (2006.01) |
| G11B 5/60 | (2006.01) |
| G11B 5/10 | (2006.01) |
| G11B 5/48 | (2006.01) |
| H01L 21/31 | (2006.01) |
| G11B 17/32 | (2006.01) |
| G11B 21/21 | (2006.01) |

(52) U.S. Cl.
CPC .......... *G11B 5/3106* (2013.01); *G11B 5/102* (2013.01); *G11B 5/48* (2013.01); *G11B 5/4806* (2013.01); *G11B 5/6005* (2013.01); *G11B 5/6082* (2013.01); *G11B 17/32* (2013.01); *G11B 21/21* (2013.01); *H01L 21/31* (2013.01)

(58) Field of Classification Search
CPC .......... G11B 5/31; G11B 5/3106; G11B 5/48; G11B 5/4806; G11B 5/60; G11B 5/6005
USPC ........................................ 360/234.5
See application file for complete search history.

(56) References Cited

U.S. PATENT DOCUMENTS

| | | | |
|---|---|---|---|
| 5,872,686 A | 2/1999 | Dorius et al. | |
| 5,886,856 A * | 3/1999 | Tokuyama | G11B 5/02 360/234.7 |
| 6,229,671 B1 * | 5/2001 | Boutaghou | G11B 5/6005 360/235.1 |
| 6,459,547 B1 | 10/2002 | Riddering et al. | |
| 6,466,410 B2 | 10/2002 | Polycarpou et al. | |
| 7,038,884 B1 * | 5/2006 | McNeil | G11B 5/6005 360/235.7 |
| 7,167,343 B2 | 1/2007 | Feliss et al. | |
| 7,193,805 B1 * | 3/2007 | Haddock | G11B 5/6005 29/603.03 |
| 7,460,336 B1 | 12/2008 | Cha et al. | |
| 7,480,120 B2 | 1/2009 | Huang et al. | |

(Continued)

*Primary Examiner* — Allen T Cao
(74) *Attorney, Agent, or Firm* — Saile Ackerman LLC; Stephen B. Ackerman

(57) ABSTRACT

A slider design for a hard disk drive (HDD) features an air-bearing surface (ABS) topography with soft bumper pads (SBP) formed proximally to corners of the leading edge and the trailing edge. The bumper pads are formed by a process that combines the use of a first photomask for subtractive etching of the ABS to form pedestals, followed by additive depositions onto the pedestals using a second lift-off photomask. The additive process deposits sequences of Si layers and diamond-like carbon (DLC) layers to produce a soft bumper pad that is energy absorbing and heat conducting, thereby protecting the recording media from surface damage and thermal erasures.

21 Claims, 5 Drawing Sheets

(56) References Cited

U.S. PATENT DOCUMENTS

| | | | |
|---|---|---|---|
| 7,573,678 B2 | 8/2009 | Motonishi | |
| 2001/0040760 A1* | 11/2001 | Hachiya | G11B 33/08 360/99.18 |
| 2005/0185343 A1* | 8/2005 | Agrawal | G11B 5/6005 360/237 |
| 2006/0171077 A1 | 8/2006 | Huang et al. | |
| 2007/0274006 A1* | 11/2007 | Yamaguchi | G11B 5/4853 360/264 |

* cited by examiner

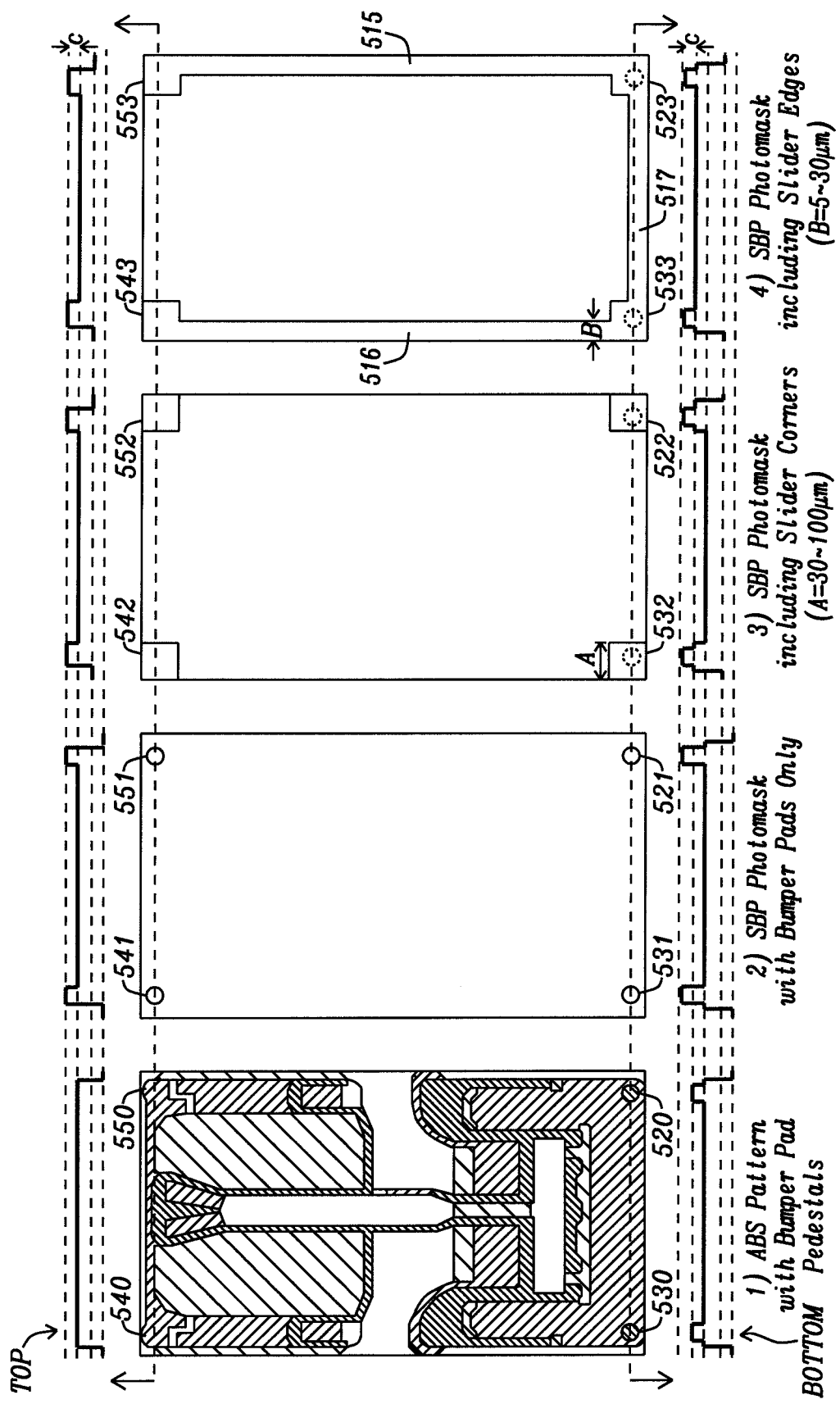

FIG. 6c-sub

FIG. 6c-add

FIG. 6d-sub

FIG. 6d-add

FIG. 6e-sub

FIG. 6e-add

ABS DESIGN WITH SOFT BUMPER PADS (SBP) FOR MITIGATING MEDIA DAMAGE AND THERMAL ERASURE IN HARD DISK DRIVES (HDD)

BACKGROUND

1. Technical Field

This disclosure relates to magnetic write heads that write on magnetic recording media, particularly to an air-bearing surface (ABS) design of such write heads that offers protection against media damage and thermal erasure during dynamic events such as operating shocks, load/unload processes and emergency power-off.

2. Description

Hard disk drives (HDD) have been increasing the recording density of the magnetic disks on which data storage occurs. Correspondingly, the thin-film magnetic heads used to write and read that data have been required to improve their performance as well. The thin-film read/write heads most commonly in use are of a composite type, having a structure in which a magnetic-field detecting device, such as a magnetoresistive (MR) read sensor is used together with a magnetic recording device, such as an electromagnetic coil inductive device. These two types of devices are laminated together and serve to read/write data signals, respectively, from/onto magnetic disks which are the magnetic recording media.

As is well known, the read/write heads are mounted in a "slider", which is a small rectangular prism that literally floats (or flys) above the surface of a rotating disk that stores the magnetic information within a HDD. The slider surface that faces the disk is called its air-bearing surface (ABS) and it is furnished with a topography that provides it with aerodynamic stability while the disk is in rotational motion.

The ABS structure of the slider plays several roles that are critical to the slider's proper operation. One of these roles relates to the provision of aerodynamic stability while the disk is in rotational motion during normal HDD operation and the slider must enable the read/write head to maintain a correct position relative to the disk surface while flying above the disk surface and normal reading and writing operations are occurring. Another function of the ABS structure is to protect the slider while it is moving to and from the surface of a rotating disk. These aspects of its operation occur, for example, while it is being unloaded from its detent position where it resides when no read/write operations are occurring, and it is being loaded into its active operating position above the rotating disk. The slider must be able to protect the disk from unanticipated adverse dynamic events during both the normal HDD operation and while moving to and from its position over the disk surface.

Referring first to FIG. 1, there is shown a 3-dimensional artist's rendering of the schematics of "Ramp Load/Unload Dynamics" sufficient to explain the motion of the slider during this phase of its operation. The essential elements of the HDD involved in this part of the HDD operation are the disk 10, the suspension/actuator 20 at whose distal end is mounted the slider 30 (not visible in this view), the ramp 40 having a detent position 50 on which the slider rests when it is not actively flying above the disk. The disk 10 has an inner diameter (ID) 12 at its axis of rotation and an outer diameter (OD), 15 and during operation the slider takes positions above the disk approximately between these two positions.

In order to achieve a higher "areal density capacity" (ADC) of stored data on the disk surface, the drive design has opened up the landing zone to obtain more area on which to read and write data, thus phasing in the concept of "load/unload over data" (LOD). The landing zone used to be an area of the disk near its inner diameter (ID) for "contact start/stop" (CSS), where the slider could touchdown on the disk, or near its outer diameter (OD) for load/unload (L/UL). No data was recorded in these regions, relative to the data zone in the central region of the disk. Along with these changes to the active surface area of a disk, the active read/write clearance between the slider and the disk surface has been dramatically reduced from approximately 10 nm (nanometers) of passive fly height to approximately 1 nm of active fly height by state of the art "fly on demand" (FOD) technology or "dynamic fly height" (DFH) technology, by the application of heat to the area around the read/write head that produces a local protrusion of the head towards the disk surface while the slider is flying above the disk surface at a height determined by aerodynamic considerations. Furthermore, media "carbon overcoat" (COC) and lubricant thickness, which serve as protective layers, are also significantly decreased in order to meet the requirement of ADC gain.

Referring to FIG. 2, there is shown a schematic illustration of a "head/media interface", showing an enlarged side cross-sectional view of a slider 300 flying above the surface (also highly magnified) of a rotating media (i.e., a disk). The disk 200 includes a substrate and underlayers 210, a magnetic layer 220 on the substrate and underlayers, a COC layer 230 on the magnetic layer, and a lubricant layer 240 over the COC layer. The angle between the slider and the disk (as shown in the cross-section) is the pitch angle, A large arrow 250 shows the direction of air flow between the slider and the disk 200. The edge of the slider 310 into which the airflow is directed is called the leading edge (LE) and the parallel edge opposite the LE is called the trailing edge (TE) 320. The surface of the slider 310 immediately adjacent to the disk is the ABS.

The slider is formed in two layers, whose structures will be shown in greater detail in FIG. 3 and FIG. 4. Layer 315, that includes the leading edge of the slider and the major portion of the ABS, is formed of AlTiC and layer 330, that includes the read/write head and ancillary heaters, 340, to activate the DFH or FOD is considered an overcoat layer and is formed of $Al_2O_3$. The figure also shows, schematically, an ABS protrusion 350 that occurs when the region surrounding the read/write head is heated. Two double-ended arrows show the reduced active clearance of the active fly height, arrow 360 with the heaters on, and arrow 370, showing the greater passive fly height (FH) when the heaters are off.

As a result of all these measures taken to meet the requirements of increased ADC, the head/media interface has become extremely critical and stressful. The lowered fly height spacing makes the data on the media extremely susceptible to loss or error in the event of accidental head/disk interactions or occasional asperity contacts. Technically, during a dynamic process, the air bearing slider becomes temporarily unstable and begins to vibrate in the pitch/roll direction, which has the propensity to cause the slider to make contact with the disk surface at the slider's corners. Such contacts results in general wear of the disk surface as well as more pronounced scratches, gouges and thermal asperities. When multiple disks are stacked together in a HDD, it is even more difficult for mechanical tolerances to be enforced by the factory processes and variations in such tolerances in the drive assembly leads to even more frequent instances of head/disk interference. Such contacts can cause catastrophic head/disk interface failures and the damage to media may include lost or corrupted data. Therefore, there is a need to explore a new technique to minimize the risk of media damage and thermal erasures when an air-bearing slider comes into contact with magnetic recording media during operating shock, load/unload events, aggressive emergency power-off events and other such unanticipated adverse interactions.

Investigation of the prior arts indicate that the problems resulting from head/disk interferences are not unknown in the industry and that measures for reducing them have been considered. Examples of prior art approaches include U.S. Pat. No. 7,460,336, Cha et al. "Slider design including stiction reduction pads", U.S. Pat. No. 7,573,678, Motonishi "Magnetic head slider with shock absorption layer and manufacturing the same," U.S. Pat. No. 6,229,671, Boutaghou et al. "Shock pads for a slider for a data storage system," U.S. Pat. No. 5,872,686, Dorius et al. "Magnetic storage system having an improved slider having rounded corners to minimize disk damage," and U.S. Pat. No. 7,167,343, Feliss et al., "Head shock resistance and head load/unload protection for reducing disk errors and defects and enhancing data integrity of disk drives." Although these prior art measures attempt to address the problem of disk damage due to head/disk contacts, they do not deal with the problem as effectively and efficiently as the present disclosure. Specifically, the objects of this disclosure are set forth as follows.

SUMMARY

The first object of this disclosure is to fabricate a slider with an ABS topography containing features that will eliminate or strongly mitigate as well as and thermal erasures of recorded media.

A second object of this disclosure is to fabricate such a slider ABS topography using materials and manufacturing processes that are inherently suited to create ABS topographies that mitigate the effects of head/disk contacts.

A third object of the present disclosure is to develop a manufacturing process using materials that will create stress-free protective structures.

A fourth object of the present disclosure is utilize materials for the slider fabrication that are matched to achieve the energy dissipation known to be required to mitigate the interactions.

A fifth object of the present disclosure is to extend the time-to-failure of a HDD by a slider ABS design that mitigates the effects of adverse head/disk interactions.

These objects will be achieved by a topographical design of a slider body and a method of implementing that design that provides the deposition of bumper pads at critical positions along the corners/edges of a slider ABS. The bumper pads are formed of a specific layered composition that makes them particularly effective at absorbing the energy of impact between a slider and a rotating disk. Methods of fabricating these bumper pads that combine additive and subtractive processes are also provided. The following is a description of the rationale behind the composition of these pads and their method of operation and formation.

Current thin film magnetic heads are sliced in a known manner from a wafer that includes a substrate layer at the leading end of the slider (see layer 315 of FIG. 2) and an overcoat layer at the trailing end (see layer 330 of FIG. 2). The substrate layer 315 is formed of extremely hard ceramic material, here, $Al_2O_3$—TiC (or, simply, AlTiC), while the overcoat layer 330 is made of relatively soft material, $Al_2O_3$. The read/write head as well as heating elements 340 are embedded in this layer of the slider, at the middle of the trailing edge 320. Due to the machining process, the individual slider often has microscopic burrs and rough, sharp edges that are rather unfriendly to disk surfaces during HDD operation. To mitigate media damage, the prior art teaches several methods to provide a more desirable set of conditions when inevitable contacts occur. Several of these approaches are included in the prior art cited above, and we cite them briefly as follows:

1) Rounded corners/edges of slider with precision "blend" process that usually compromises flying characteristics and results in many hard particles;

2) Shock-absorbing pads or an overcoat layer formed of a polymer or metal material at the corners of the slider, which would make the head suffer foreign hydrocarbon contamination or produce corrosion concerns;

3) Projecting pads etched out from a shock-absorbing layer coating with $SiO_2$ or $Al_2O_3$ at the leading edge of the slider, which significantly increases the cost and lead time of slider fabrication. $SiO_2$ and $Al_2O_3$ both have poor thermal conductivity compared to Si.

4) Stiction reduction pads beyond the ABS top surface capped with thick diamond-like carbon (DLC) on a pedestal base using vacuum etching/depositing process, which had been traditional in older disk drives, but would be too hard for the present media surfaces.

During slider fabrication, the ABS topography for properly stable aerodynamic support of the slider body over a spinning disk is formed by a "subtractive" vacuum process, such as ion milling (IM) and reactive ion etching (RIE) to remove selected portions of the slider body surface, followed by a DLC coating on a rowbar level (i.e., before slicing individual sliders). As is shown in the prior art examples of FIG. 3 and FIG. 4, the designed-in (as part of the ABS formation process) bumper pads of this approach are usually placed at the leading edge (LE) and the trailing edge (TE), near the corners of the slider. Typically, the TE bumper pads have a lower elevation than the ABS top surface, given the effects of the pitch/roll angles, while LE bumper pads have the same or higher elevation than the ABS top surface. In this way, the bumper pads can insure the maximum protection of the media by providing a smooth/rounded contact edge for interfacial contacts with the disk surface. Unfortunately, except for those formed in the TE $Al_2O_3$ layer, bumper pads within the slider substrate layer, made of much harder AlTiC, are too abrasive to protect the media surface during head/disk interactions, especially for current ultrathin COC and lubricant.

Silicon (Si) is well known in the fabrication of magnetic sliders, where it is used as the thin (approximately 8-10 A) seed layer of the DLC thin film coated on the slider ABS to prevent slider wear and corrosion. It has superior properties of adhesion, softness and thermal conductivity so that it can fundamentally reduce comparative Hertzian contact damage and thermal erasures to prolong drive operating time to failure (TTF) or test truncation. Therefore, Si can now be the first choice over other materials to overcome the limitations of the prior art for depositing a relatively "soft" energy absorbent and thermally conductive material onto the bumper pads, slider corners or slider edges, where substantial head/disk contacts are prone to occur based on the theory and practice of L/UL events, operating shocks, unanticipated touchdowns, etc., while not leading to adverse effects on slider reliability.

Although a particular ABS is illustrated as an exemplary slider embodiment in FIGS. 3 and 4, the soft bumper pad (SBP) structures and methods of their fabrication is universal and not limited to any particular ABS design. Using the photomask schemes to be shown in FIG. 5b-5d, the soft bumper pads (SBP) can easily be transferred to any air bearing slider topographies by known "additive" vacuum processes, such as lift-off deposition processes, which provides a high rate of coating silicon to form a low stress silicon layer. Preferably the thickness of the silicon coating (C-dimension) is between approximately 50-300 A (angstroms). The corner square (A-dimension) ranges between approximately 30-100 µm (microns) in side length and the edge band (B-dimension) ranges between approximately 5-30 µm, without significant impact on fly performance (aerodynamic stability). It must be understood, however, that these dimensional ranges are preferred but SBPs are not limited to these specific dimensions. Thus SBPs, preferably including slider corners or edges, are sufficiently capable of providing a buffer to absorb/dampen contact forces as well as providing an interface with good thermal conductivity/diffusivity between the slider and the disk during dynamic events without mechanical damage to media and thermal erasures of recorded data. In addition, it is desirable that the SBP silicon layer associated with the DLC layer capped on the slider (i.e., trailing edge layer 320 of FIG. 2) has sufficient mechanical strength and sufficient wear resistance and durability to satisfy those operational characteristics of the HDD. The thin layer of DLC provides a low friction/stiction interface for contacts with the disk surface, and the Si underlayer has a thermal conductivity closer to that of DLC than other known (e.g., man-made) materials with the exception of some metals, thereby preventing uneven thermal expansion and resulting mechanical stresses between the Si and the DLC. Thus, the SBP provided herein creates a highly desirable contact interface between the disk surface and the slider and, in addition, the SBP is designed to protect the disk media under certain critical operating conditions. This combination will insure that media surfaces (e.g., disk surfaces) will remain pristine and error free.

BRIEF DESCRIPTION OF THE DRAWINGS

FIG. 5a-5d is a series of schematic illustrations illustrating three alternative additive photomask schemes (5b, 5c, 5d) to be added to the topography of 5a (or that of FIG. 3 or FIG. 4) for fabricating the ABS topography and SBP of exemplary embodiments of the slider of the present disclosure.

FIG. 6c-sub through 6e-sub show the subtractive process that follows 6a-6b for creating pedestals.

FIG. 6c-add through 6e-add show the additive process that follows 6c-sub through 6b-sub for creating the final soft bumper pads using those pedestals.

DETAILED DESCRIPTION

We describe a slider and its method of fabrication for use in an HDD, the slider having an ABS topography that includes bumper pads at edge and corner positions that mitigate the adverse effects of a wide variety of slider/media interactions including those that lead to media damage and/or thermal erasure of recorded data.

Figure 1:
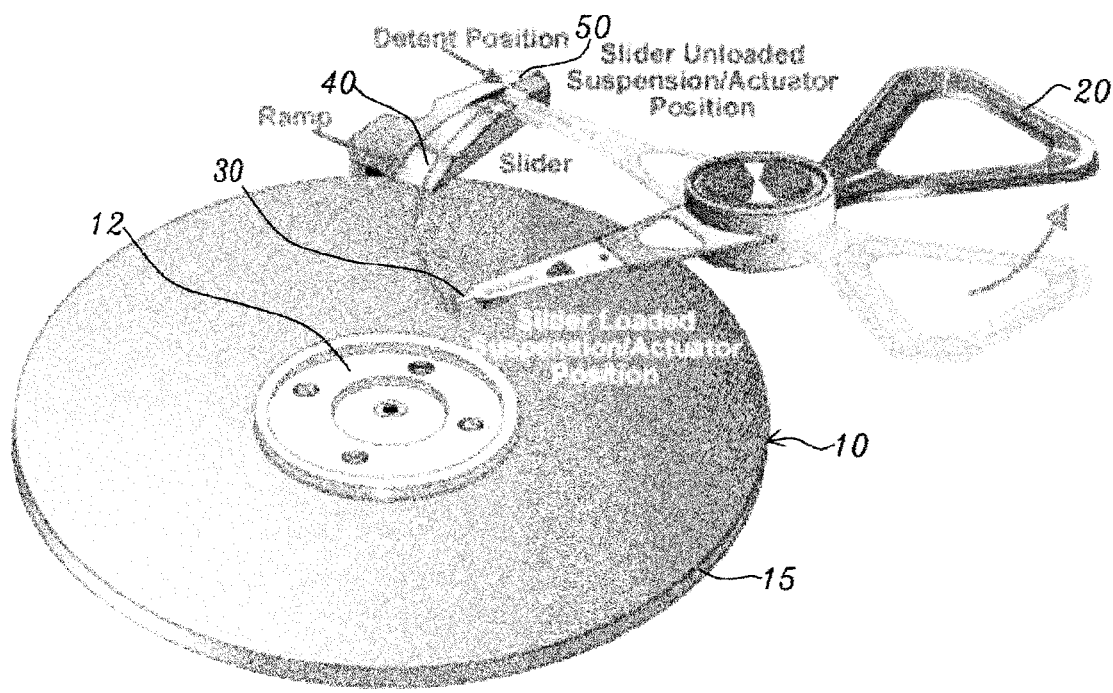
FIG. 1 is a schematic 3-dimensional artist's rendering showing ramp load/unload dynamics of a single disk in a HDD.
Figure 2:
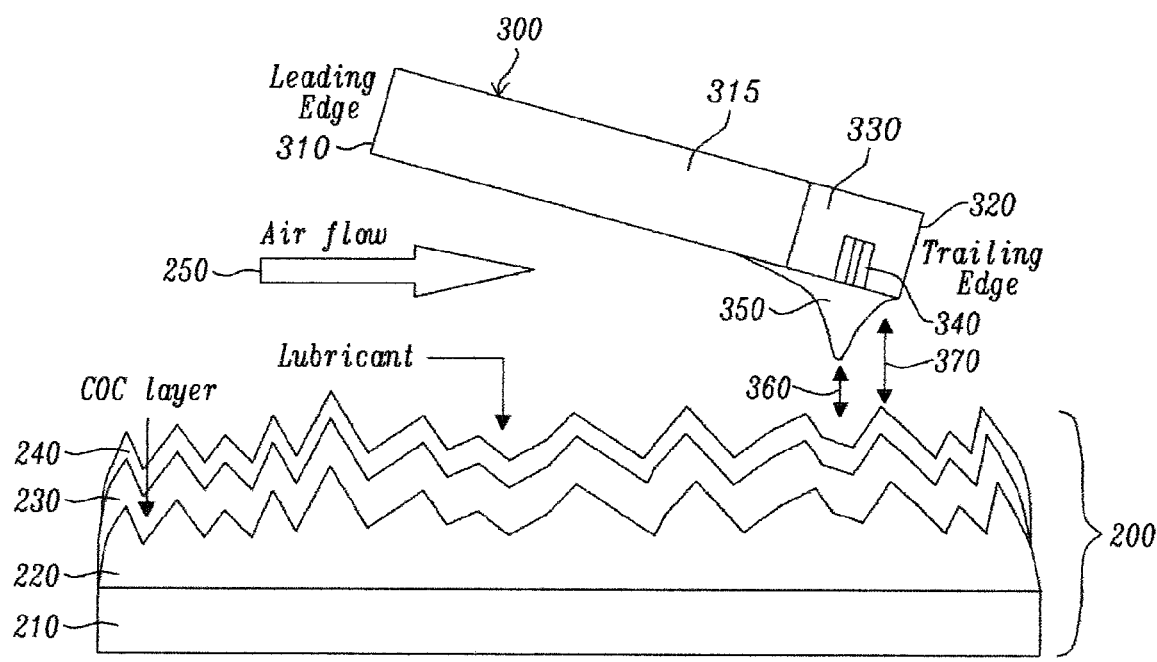
FIG. 2 is a schematic cross-sectional illustration of a head/media interface during drive operation.
Figure 3:
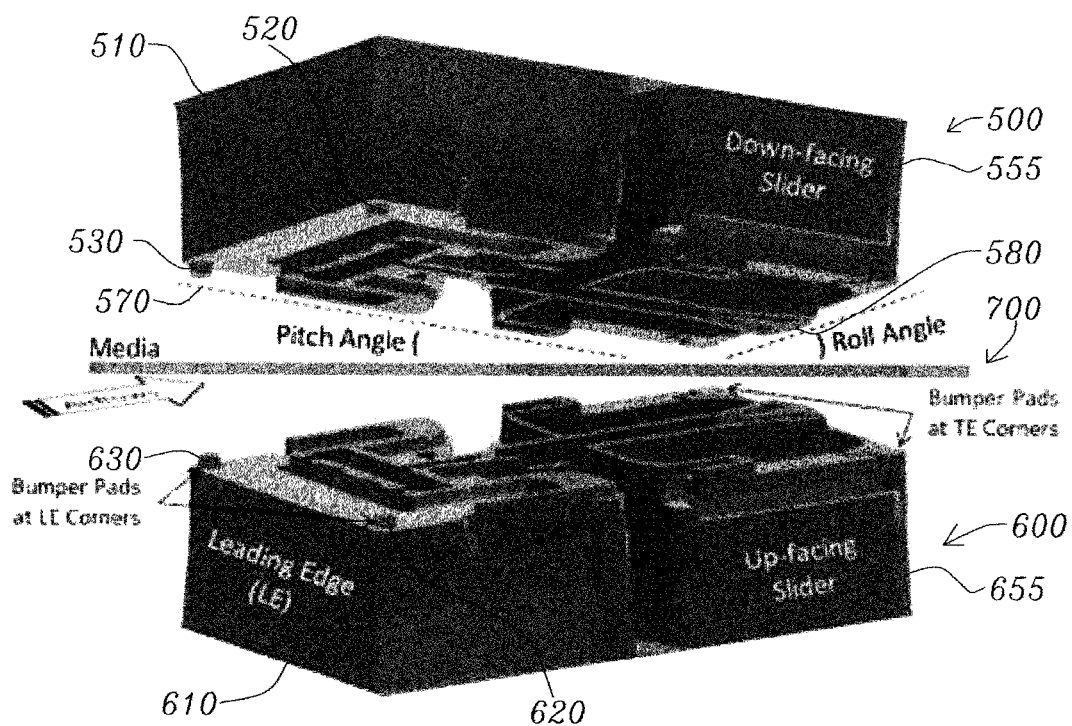
FIG. 3 is a schematic 3-dimensional artist's rendering showing two identical prior art sliders disposed above and below a disk, both of which lack the soft bumper pads (SBP) that would satisfy the objects of the present disclosure.

Referring first to FIG. 3, there is shown, schematically, an artist's 3-dimensional rendering of a pair of identical sliders 500, 600 whose ABS's are oppositely and symmetrically disposed to either side of a spinning magnetic disk 700 as may be found in a typical HDD. These sliders could be made to meet the objects of the present disclosure by the formation of soft bumper pads (SBP) at critical positions along the ABS of each slider. Each slider has a pair of cylindrical bumper pads 520, 530, 620, 630 located at opposite corners of a leading edge 510, 610. Each slider also has a pair of flat, non-cylindrical bumper pads 540, 550, 640, 650 located at opposite corners of a trailing edge 555, 655. These pads are not yet the soft bumper pads (SBP) of the present disclosure, but they can be further processed to become SBP as will be described below. We will call these pads, "bumper pad pedestals", because the SBP will be formed on them. In the prior art, they are simply "bumper pads," as they do not yet have the additional "soft" structures of the present disclosure that will give them the mechanical energy dissipating and heat dissipating properties.

As shown in the figure, the sliders are in aerodynamic flight above the rotating disk (also denoted the recording "media") and the position of the slider body relative to the disk surface is characterized by two angles between the slider edges and the disk surface (identified here for slider 500), the pitch angle 570 and the roll angle 580. Note that the pitch angle raises the leading edge away from the disk further than the trailing edge.

Figure 4:
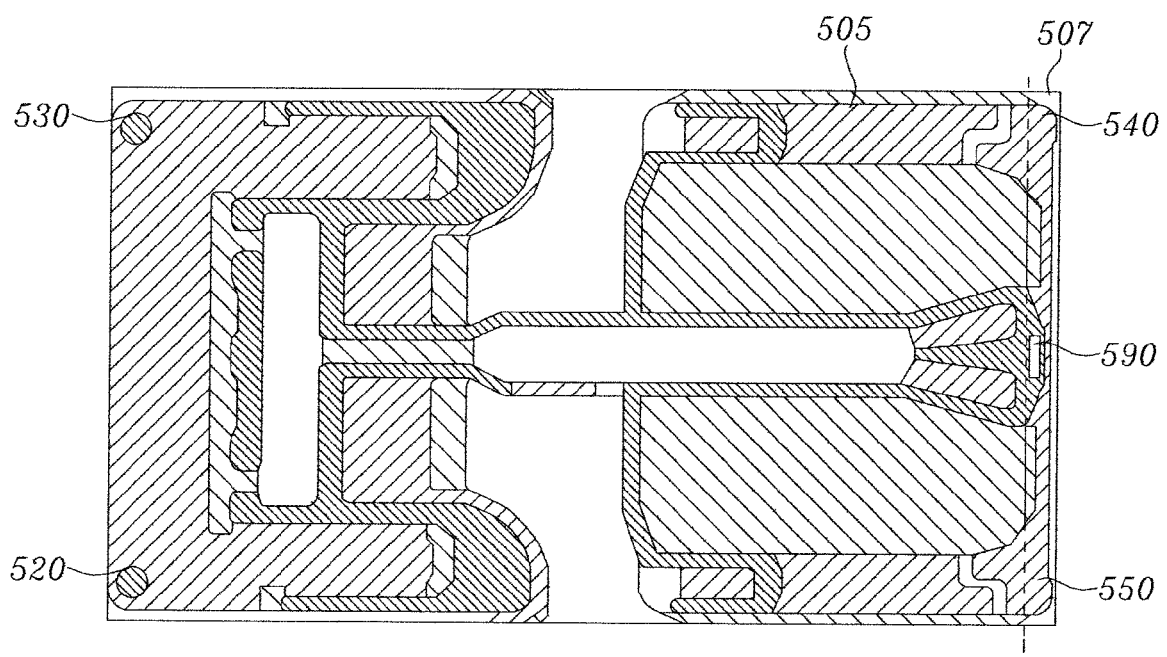
FIG. 4 is a schematic representation of the ABS topography of either of the prior art sliders of FIG. 3.

Referring next to schematic FIG. 4, there is shown the surface topography of the ABS of either of the two identical sliders of FIG. 3. These sliders are shown with an exemplary topography for the ABS, but it is understood that the details of this topography are quite general and the in-flight aerodynamic stability provided by the topography will not be adversely affected by the beneficial effects of the SBP that will be added to provide the mitigation of adverse dynamic events. Note that the more densely shaded areas of FIG. 4 are meant to correspond to higher surface portions of the ABS but the shadings are to be considered as approximate and schematic only.

FIG. 4 shows more clearly the ABS topography of either of the identical exemplary prior art sliders 500 or 600 of FIG. 3. The illustration shows the two layers forming the slider: the hard AlTiC substrate layer 505 and the softer $Al_2O_3$ capping layer 507 just beyond the dashed vertical line. The capping layer includes the head element 590. The trailing edge corners include two bumper pad pedestals 540 and 550. The leading edge corners include bumper pad pedestals 520 and 530. These pad pedestals have all been formed by a subtractive etching process that occurs during the patterning of the slider ABS and that will be described with reference to FIG. 5a-5d below. In order to form the complete soft bumper pads (SBP) on the pedestals, it will be necessary to utilize an additive deposition process in which a thick silicon layer or a sequence of layers including DLC and Si is deposited onto the already formed pedestals using one of the SBP photomask schemes of FIG. 5b-5d in a "lift-off" additive process, where additional material is deposited in a vacuum using the photomask pattern and then the photomask is lifted off. Finally, a DLC film may be deposited over the entire ABS as usual.

Referring now to FIGS. 5a-5d, there is first shown an initial ABS pattern (5a) identical to that shown in FIG. 4, having bumper pad pedestals, 520, 530 on the leading edge corners already formed by the subtractive process of etching away portions of the ABS surface. The trailing edge of the ABS has pedestal regions 540, 550, which will also serve for the formation of bumper pads.

Figures 6A, 6B:
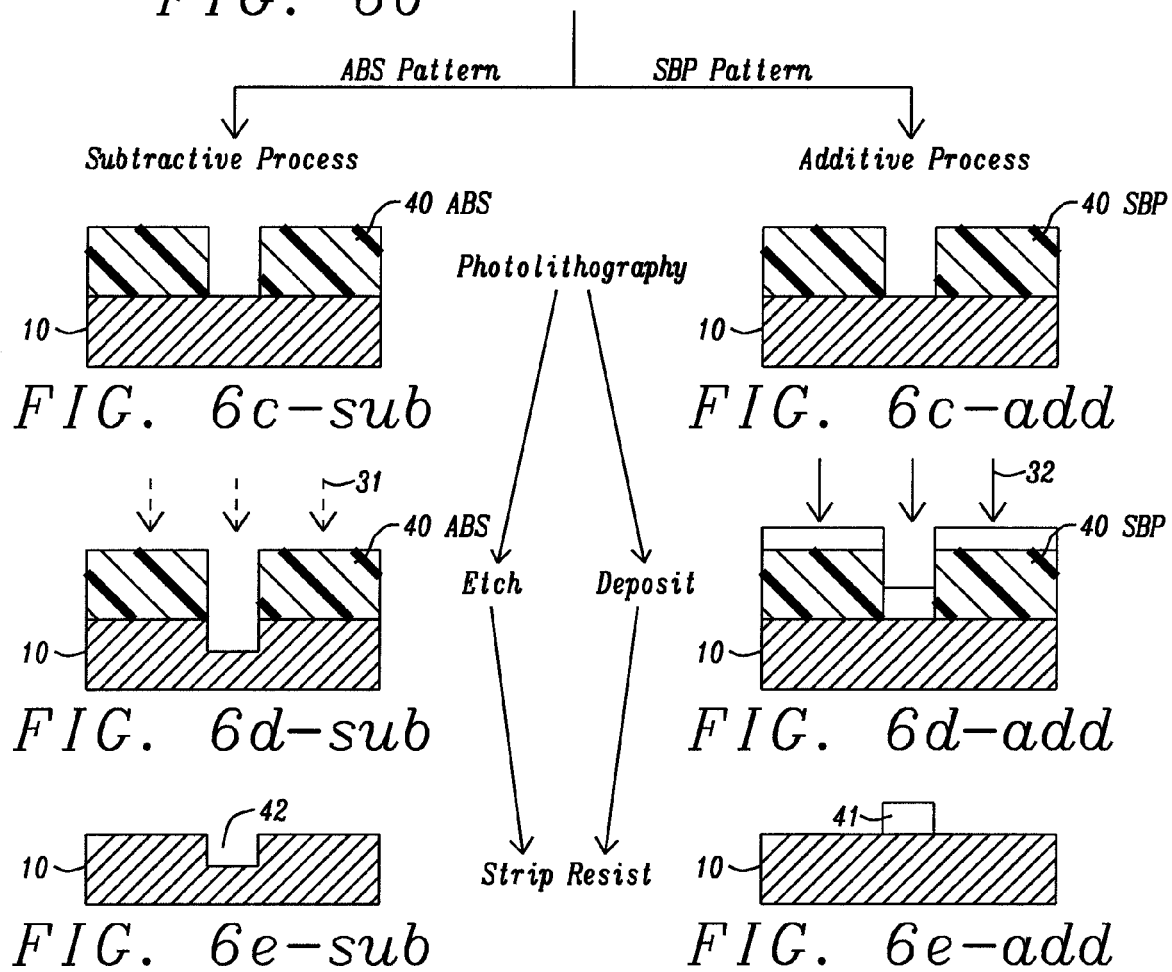
FIG. 6a-6b are the first two steps in a schematic illustration of an exemplary process flow that leads to the present soft bumper pads.

Referring now to FIGS. 5b-5d, there are shown three alternative photomasks for independent schemes that can be used to form different versions of the present SBP by an additive coating process (to be described in detail in FIG. 6 and FIG. 7) when applied to the ABS pattern of FIG. 5a.

Referring to the top (TOP) and bottom (BOTTOM) portions of each of FIGS. 5a-5d, there are shown edge cross-sectional views in a plane perpendicular to the figure plane indicating the topography of the ABS at the leading (bottom of figure) edge and trailing (top of figure) edges of the ABS.

FIG. 5a (TOP) shows that the ABS, formed by a subtractive process before any SBP formation, is of uniform height along the trailing edge (between corners 540, 550), whereas the ABS at the leading edge portion (BOTTOM) shows the ABS pattern with cylindrical bumper pad pedestals 530, 520 on each corner of the leading edge. Because of the required pitch angle, the leading edge of the slider flies higher relative to the disk surface than the trailing edge, allowing the pedestals 520 and 530 a corresponding greater elevation relative to the ABS than the pedestals on the trailing edge, 540 and 550. The trailing edge has a lower elevation relative to the disk surface than the ABS top surface (uppermost horizontal dashed line), while the two cylindrical bumper pad pedestals, 520 and 530, on each corner of the leading edge, have the same elevation as the ABS, which makes them higher than 540 and 550 at the trailing edge.

Remaining FIGS. 5b-5d illustrate three independent photomasks that can be applied, as part of an additive process, to the slider ABS of FIG. 5a to deposit SBP bumper pads of various shapes to the pedestals, 520, 530, 540 and 550, at the four corners of FIG. 5a. The differences between these three masking schemes are given in FIGS. 5b-5d are as follows.

In FIG. 5b, the SBP deposition area is only on the four cylindrical pedestals shown as 520, 530, 540 and 550 in FIG. 5a. The deposition takes place through the circular openings in the mask, 541, 551, 531 and 521.

In FIG. 5c, the SBP deposition area is within four square open regions at the corners of the slider of FIG. 5a, surrounding the pedestals shown in FIG. 5a as 520, 530, 540 and 550. The deposition takes place through corresponding square openings in the mask 542, 552, 532 or 522 and each deposition covers a corresponding pedestal beneath those openings.

In FIG. 5d, the SBP deposition area includes the leading and side edges and the four corners of the slider. The corresponding regions of the mask are 543, 553, 533 and 523 for the square regions at the slider corners and three edge bands are shown as 515 and 516 for the side bands and 517 for the leading edge band.

Referring again to FIG. 5b, there is shown a photomask with circular openings 541, 551, 531 and 521, at each corner of the mask. Openings 531 and 521 on the leading edge will allow a deposition onto the leading edge of the ABS of FIG. 5a covering the tops of pedestals 530 and 520. Openings 551 and 541 will allow the deposition of soft bumper pads on the two corners 540 and 550 of the trailing edge of the ABS of FIG. 5a. The height of the deposition has a vertical dimensional range denoted C, where C is between approximately 50-300 angstroms and is indicated by the vertical spacing between the horizontal dashed lines.

Referring again to FIG. 5c, there is shown an alternative photomask that can be applied to the ABS of FIG. 5a to create alternative soft bumper pads that are formed by depositing square structures on the pedestals at the slider corners. These corner structures are denoted here by square openings 542, 552, 532 and 522 with a horizontal dimensional range denoted A, between approximately 30-100 µm (micrometers). The small dashed circles at the centers of the squares 532 and 522 are meant to show the bumper pedestals over which are now deposited the square SBP structures. At the trailing edge corners, similarly to the leading edge corners, the square openings 542 and 552 are used to deposit SBP of height C between approximately 50-300 angstroms and horizontal dimension A between approximately 30-100 µm.

Referring finally to FIG. 5d, there is shown a third alternative photomask that is patterned to deposit Si edge bands 515, 516, 517 around the leading edge of the ABS and along the side edges that connect the leading and trailing edges. These edge bands will range in width between approximately 5-30 µm. The four square corner openings 543, 553, 533 and 523 (also produced by the use of the photomask of FIG. 5c) still remain and now connect with the side edge bands. We note that typically a thick Si layer will be deposited on the pedestals as part of the process using any of the photomasks in FIGS. 5b-5c. The Si deposition process is a standard vacuum process such as used in depositing thin Si undercoats as seed layers for DLC, where the Si thickness is between approximately 8-10 A. In the soft bumper pads, however, the thickness of the Si deposition is between approximately 50-300 A and when formed in that thickness the Si is a dense, low stress deposition that has the properties of mechanical and thermal energy dissipation, heat conduction, and adhesion, that produce the desirable properties of the soft bumper pads.

Referring now to FIG. 6a-6e, there is shown schematically how the photomask schemes of FIGS. 5b-5d can be used for both the subtractive process of etching a slider ABS pattern and for the additive process of depositing SBP material on the ABS to create the soft bumpers that meet the objects of the disclosure. FIG. 6a-6e is structured as a two-sided process flow chart, with the left side describing the use of a photomask in a subtractive process to create the ABS pattern and the right side describing the use of a photomask in an additive process to create the SBP pattern. Prior to the division of the process flow into two parallel sides, there is a single process flow (6a-6b) component that is common to both.

Referring now to the process flow of FIG. 6a-6e, there is shown first, schematically, the photolithographic process required for the creation of a photomask, which will be a common element in both additive and subtractive processes, which are carried out independently. The initial step, denoted 6a, is the creation of an exemplary photomask that will cover the surface of a rowbar (a multi-slider wafer structure that will be finally sliced into individual sliders) of slider bodies formed of the hard material $Al_2O_3$—TiC. The rowbar, 10, is covered by a layer of photoresist, 20, which is illuminated by radiation (arrows), 30, (typically UV light) through a patterned photomask 50 that contains the required pattern for either the etched ABS topography or the additive SBP structures.

Referring to 6b, there is shown the photoresist 20 that has been exposed by the radiation and will then be developed to create the transferred pattern of openings 40 in the photoresist. We will denote the patterned photoresist either 40 ABS or 40 SBP according to whether the developed pattern is appropriate for the ABS or for the SBP. These steps will be carried out twice, once to create a photomask patterned photoresist layer on the rowbar to pattern the ABS by a subtractive (etching) process and, a second time, to create a photomask patterned photoresist layer on the ABS patterned rowbar to now pattern the SBP by an additive process of multiple depositions. We will describe the process steps: 6c-sub, 6d-sub and 6e-sub, for the subtractive process first, followed by the independent additive process steps: 6c-add, 6d-add and 6e-add. Referring first to 6c-sub, there is shown the ABS photomask patterned photoresist, 40-ABS, that has been formed in steps 6a and 6b and is now positioned on rowbar 10.

Referring to 6d-sub, there is shown an etching process 31 (dashed arrows), such as reactive-ion etch or ion-milling (RIE/IM), that is carried out through the patterned ABS photoresist 40 ABS.

Referring to 6e-sub, there is shown the rowbar 10 with the ABS pattern 42 now having been transferred to it by etching and the ABS photomask patterned photoresist having been stripped away in preparation of the SBP additive processes, 6c-add, 6d-add and 6e-add.

Referring to 6c-add, there is shown the SBP photomask patterned photoresist 40 SBP now having been formed on the rowbar 10 by a photolithographical process identical to 6a and 6b. The rowbar is assumed to be already patterned by the ABS subtractive process producing, for example, pedestals on which to form the SBPs, although that patterning is not shown. For simplicity, the SBP patterned photoresist 40 SBP is shown with a similar pattern to the ABS patterned photomask.

Referring next to 6d-add, there is shown an exemplary deposition process in which Si is sputtered (dashed arrows 32) onto the rowbar 10 through the opening(s) in the SBP mask 40-SBP.

Finally, 6e-add schematically shows that the SBP-patterned photoresist 40 SBP has been lifted off, leaving behind an additive SBP element 41 formed of Si that now covers the appropriate pedestals in the ABS. Note that the SBP pattern might be any of the photomask patterns illustrated in FIG. 5b, 5c or 5d, depending upon how it is desired to treat the ABS.

Figure 7A:
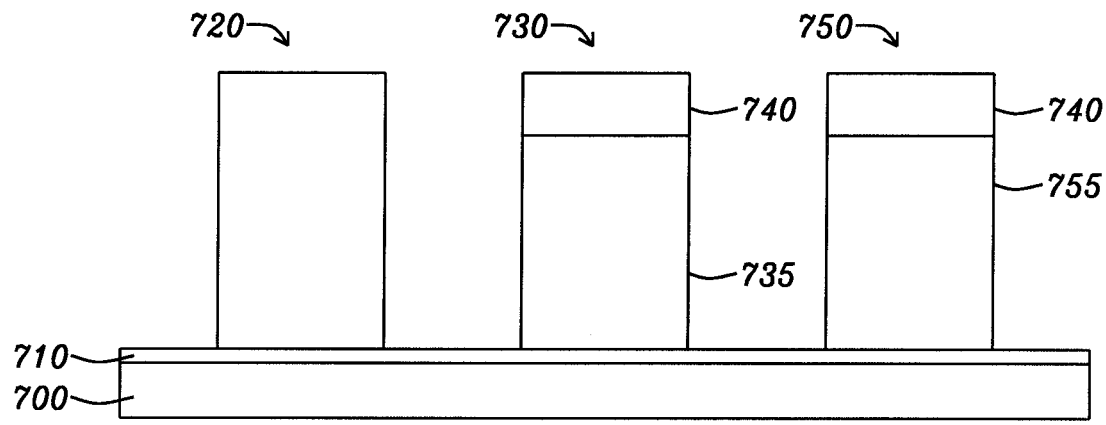
FIG. 7a is a schematic illustration showing a portion of a prior art slider using three possible prior art bumper pads.
Figure 7B:
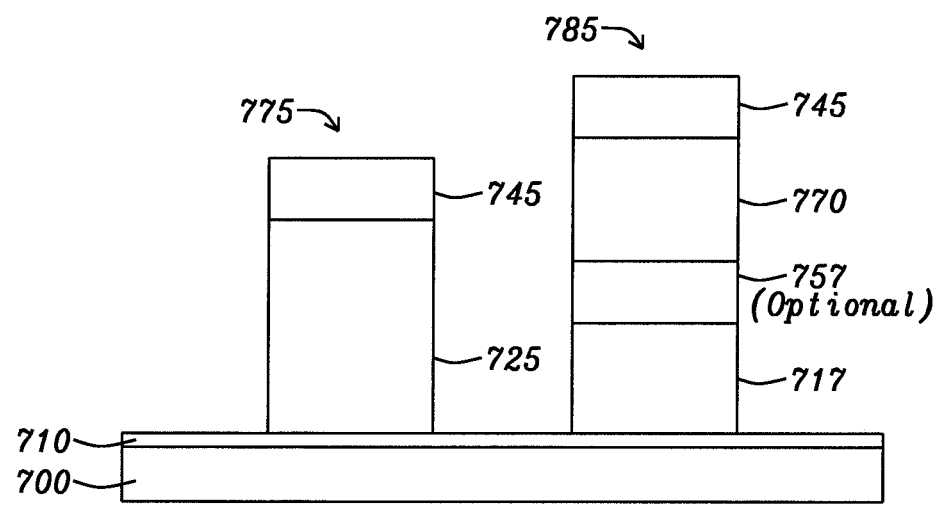
FIG. 7b shows a corresponding portion of the slider of the present disclosure showing two possible SBP structures.

Referring now to FIGS. 7a and 7b, there is shown schematically the differences in composition of what we will generally call a "function pad," on the ABS surface of a slider between the present SBP structure and pads intended to perform similar functions in the prior art, but not doing so effectively. The function pad performs a certain function based on its shape and composition and FIG. 7a shows three exemplary function pads of the prior art, while FIG. 7b shows two exemplary SBP pads of the present disclosure.

FIG. 7a shows three pads, 720, 730, and 750 that are characteristic of the structures in the prior art, all formed on a hard slider body 700 of $Al_2O_3$—TiC (AlTiC) on which has been formed a thin layer 710 of hard, thermally conductive material, such as DLC or Si seed material. Three types of function pads are shown. Pad 720 is entirely formed of DLC; pad 730 is formed as a thin layer of DLC 740 formed on the top of a pedestal of AlTiC 735. Pad 750 shows a layer of DLC 740 formed on top of a pedestal 755 of Metal/Polymer/$SiO_2$/$Al_2O_3$.

FIG. 7b shows two function pads, 775 and 785, that are the SBP pads of the present disclosure. The pads are formed on a hard slider body of AlTiC 700 over which has been formed a thin layer 710 of hard, thermally conductive material, such as DLC or Si as a seed layer. Pad 775 is a thick layer of Si 725 on which is formed a capping layer of DLC 745. Pad 785 is a pedestal of AlTiC 717 on which is optionally formed a layer of DLC 757, on which is formed a layer of Si 770 and, finally, on which is formed a thin film layer of DLC 745. Note that the layers of Si, either 725 or 770, are not the thin layers (approximately 8-10 A) of Si, such as seed layer 710, but are thicker layers (approximately 50-300 A) of dense, low stress Si, that will serve as energy absorbing layers in the event of head/media interactions.

As is understood by a person skilled in the art, the present description is illustrative of the present disclosure rather than limiting of the present disclosure. Revisions and modifications may be made to methods, materials, structures and dimensions employed in forming and providing a HDD-mounted slider having an ABS topography that includes soft bumper pads (SBP) that eliminate media damage and thermal erasures during unanticipated head/media interactions while still forming and providing such a device and its method of formation in accord with the spirit and scope of the present disclosure as defined by the appended claims.

What is claimed is:

1. A slider for a hard-disk drive (HDD) comprising:
    a slider body of substantially rectangular horizontal cross-section having a leading edge (LE), a trailing edge (TE) parallel to said leading edge, parallel side edges connecting said leading and trailing edges and an upper air-bearing surface (ABS) having a topography that provides aerodynamic stability to said slider body during operation of said HDD; wherein
    said ABS includes horizontally rounded bumper pad pedestals located proximate to distal ends of said LE and said TE, wherein
    said bumper pad pedestals have soft bumper pads (SBP) formed thereon that either comprise a layer of dense, low stress Si of a thickness between approximately 50-300 angstroms, or comprise a laminated sequence of layers of dense low stress Si of a thickness between approximately 50-300 angstroms, alternating with layers of DLC (diamond-like carbon), mitigate media damage and thermal erasures in said HDD during head/media interface interactions and other dynamic events, while not adversely affecting said aerodynamic stability during normal HDD operation.

2. The slider of claim 1 wherein said soft bumper pads are coated to reduce friction/stiction when head/media interface interactions occur.

3. The slider of claim 1 wherein said bumper pad pedestals proximate to said LE end corners have the same or higher elevation as the ABS top surface.

4. The slider of claim 1 wherein said bumper pad pedestals proximate to said TE end corners have a lower elevation than said ABS top surface.

5. The slider of claim 1 wherein said soft bumper pads are of square horizontal cross-section of side between approximately 30 and 100 μm or of circular horizontal cross-section of diameter between approximately 30 and 100 μm.

6. The slider of claim 1 further including a band of Si formed along the length of said LE and extending along both parallel edges connecting said LE to said TE and contacting each pedestal of said SBP of square horizontal cross-section.

7. The slider of claim 6 wherein said band of Si is between approximately 50 and 300 angstroms in height and between approximately 5 and 30 μm in width as measured inward from the slider edges.

8. The slider of claim 6 wherein said regions of approximately square cross-section are between approximately 30-100 μm on a side.

9. The slider of claim 1 wherein said sequence of alternating layers includes a final layer of DLC that provides a low friction/stiction surface to interface advantageously with a media surface.

10. The slider of claim 1 wherein said layer of high density, low stress Si provides an energy absorbing layer having superior properties of adhesion, softness and thermal conductivity to mitigate contact damage and prevent thermal erasures.

11. A method to fabricate a slider for a hard-disk drive (HDD) comprising:
providing a rowbar configured to provide a multiplicity of identical slider bodies, each body having a smooth, planar surface of rectangular horizontal cross-section; then applying a subtractive process, forming an identical aerodynamically stable patterned air bearing surface (ABS) on each of said slider bodies by etching a topography into each said slider body through said smooth, planar surface by using a first patterned photomask and a corresponding succession of ion-milling (IM) and/or reactive ion etching (RIE) steps to transfer said ABS pattern to all potential sliders in said rowbar and, thereafter, removing said first photomask;
wherein said patterned ABS includes horizontally rounded bumper pedestals formed proximally to each corner of said ABS;
then, using a second patterned photomask of appropriate pattern, applying an identical additive vacuum lift-off process to each said patterned ABS bumper pedestal wherein said bumper pedestals are further modified by a deposition of soft bumper pads (SBP) by means of a material deposition thereon; wherein
using said vacuum lift-off process, said SBP are formed either as a layer of dense, low-stress Si having a thickness between approximately 50-300 angstroms or as a laminated sequence of alternating layers including layers of dense, low-stress Si of thickness between approximately 50-300 angstroms alternating with layers of diamond like carbon (DLC), on said bumper pad pedestals; then
lifting off said patterned photomask and subdividing said rowbar into individual sliders.

12. The method of claim 11 wherein said bumper pad pedestals proximate to said LE corners are formed to have the same or higher elevation as ABS top surface.

13. The method of claim 11 wherein said bumper pad pedestals proximate to said TE corners are formed to have a lower elevation than said ABS top surface.

14. The method of claim 11 wherein said second photomask is patterned to deposit said SBP within a region of approximately square or circular cross-section of side dimension between approximately 30 to 100 microns at each corner of said LE and said TE.

15. The method of claim 14 wherein said second photomask is patterned to deposit said SBP together with a band of Si along the length of said LE, said band having a width of between approximately 5 and 30 microns and intersecting said square regions at opposite corners of said LE regions and said band extending identically along both parallel edges connecting said LE to said TE.

16. The method of claim 15 wherein said band of Si is between approximately 50 to 300 angstroms in height from the top of said pedestal and between approximately 5 and 30 μm in width as measured inward from said slider edges.

17. The method of claim 14 wherein said regions of approximately square or circular cross-section are between approximately 30-100 microns on a side.

18. The method of claim 11 wherein said sequence of alternating layers includes a final layer of DLC that provides a low friction/stiction surface to interface advantageously with a media surface.

19. The method of claim 16 wherein said layer of Si provides an energy absorbing layer having superior properties of adhesion, softness and thermal conductivity to mitigate contact damage and thermal erasures.

20. The method of claim 11 further including deposition of a thin protective layer of DLC covering said SBP formations.

21. The method of claim 11 wherein said additive lift-off process is a deposition by sputtering process.

* * * * *